US011825591B2

(12) United States Patent
Sato

(10) Patent No.: US 11,825,591 B2
(45) Date of Patent: Nov. 21, 2023

(54) SEMICONDUCTOR MODULE

(71) Applicant: FUJI ELECTRIC CO., LTD., Kawasaki (JP)

(72) Inventor: Yushi Sato, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 718 days.

(21) Appl. No.: 17/003,722

(22) Filed: Aug. 26, 2020

(65) Prior Publication Data

US 2021/0120706 A1    Apr. 22, 2021

(30) Foreign Application Priority Data

Oct. 18, 2019  (JP) ................................ 2019-190626

(51) Int. Cl.
| | |
|---|---|
| *G01K 7/00* | (2006.01) |
| *H05K 7/20* | (2006.01) |
| *H01L 25/065* | (2023.01) |
| *H01L 25/07* | (2006.01) |
| *H05K 1/14* | (2006.01) |

(Continued)

(52) U.S. Cl.
CPC .......... *H05K 7/20927* (2013.01); *G01K 7/22* (2013.01); *G01R 31/52* (2020.01); *H01L 25/0655* (2013.01); *H01L 25/072* (2013.01); *H05K 1/0204* (2013.01); *H05K 1/142* (2013.01); *H05K 1/18* (2013.01); *H05K 2201/10151* (2013.01); *H05K 2201/10166* (2013.01)

(58) Field of Classification Search
CPC ...... H05K 7/20927; H05K 1/142; H05K 1/18; H05K 2201/10151; H05K 2201/10166; G01R 31/52; G01K 7/22; H01L 25/0655; H01L 25/072

USPC ......................................................... 257/722
See application file for complete search history.

(56) References Cited

U.S. PATENT DOCUMENTS

| | | | | |
|---|---|---|---|---|
| 2008/0018352 A1* | 1/2008 | Chiba | ................ | G01R 31/2865 324/750.04 |
| 2008/0280451 A1* | 11/2008 | Ohmoto | ............ | H01L 21/67109 156/345.28 |

(Continued)

FOREIGN PATENT DOCUMENTS

| | | | | |
|---|---|---|---|---|
| CN | 101752356 A | * | 6/2010 | ......... H01L 23/3735 |
| CN | 111146160 A | * | 5/2020 | ......... B60R 16/0231 |

(Continued)

*Primary Examiner* — Gail Kaplan Verbitsky
(74) *Attorney, Agent, or Firm* — Rabin & Berdo. P.C.

(57) ABSTRACT

A semiconductor module, including a cooler having first and second flow passages respectively formed on first and second sides of the semiconductor module that are opposite to each other, and a third flow passage connecting the first and second flow passages. The semiconductor module further includes a laminated substrate disposed on the cooler and having first to third circuit boards, a first sensing chip having a sensing function for detecting a temperature and a first non-sensing chip not having the sensing function, disposed on the first circuit board side by side along the third flow passage, and a second sensing chip having the sensing function and a second non-sensing chip not having the sensing function, disposed on the third circuit board side by side along the third flow passage. The first and second sensing chips are respectively disposed on the second side and the first side of the semiconductor module.

8 Claims, 7 Drawing Sheets

(51) Int. Cl.
  *H05K 1/02* (2006.01)
  *G01K 7/22* (2006.01)
  *G01R 31/52* (2020.01)
  *H05K 1/18* (2006.01)

(56) References Cited

U.S. PATENT DOCUMENTS

| | | | |
|---|---|---|---|
| 2009/0205802 A1 | 8/2009 | Yoshida et al. | |
| 2017/0213777 A1 | 7/2017 | Soyano | |
| 2020/0266126 A1* | 8/2020 | Arai | H05K 7/209 |
| 2021/0005528 A1* | 1/2021 | Kamimura | H01L 23/3675 |
| 2023/0135461 A1* | 5/2023 | Aoki | H01L 23/46 |
| | | | 257/675 |

FOREIGN PATENT DOCUMENTS

| | | | | |
|---|---|---|---|---|
| CN | 112119487 A | * | 12/2020 | G01R 31/2862 |
| CN | 113767454 A | * | 12/2021 | C23F 1/12 |
| CN | 115398603 A | * | 11/2022 | |
| CN | 115877162 A | * | 3/2023 | |
| DE | 112014006352 T5 | * | 10/2016 | H01L 23/50 |
| ES | 2282745 T3 | * | 10/2007 | H01L 23/34 |
| JP | H07245363 A | * | 9/1995 | |
| JP | 2006-303264 A | | 11/2006 | |
| JP | 2007043042 A | * | 2/2007 | H01L 21/67103 |
| JP | 2007-287988 A | | 11/2007 | |
| JP | 2008-021721 A | | 1/2008 | |
| JP | 6513326 B2 | * | 5/2019 | H01L 21/02 |
| JP | 7001186 B1 | * | 1/2022 | H01L 21/4807 |
| JP | 2022533606 A | * | 7/2022 | |
| JP | 7150184 B2 | * | 10/2022 | H01L 23/5386 |
| JP | 2022547236 A | * | 11/2022 | |
| KR | 20220105761 A | * | 7/2022 | |
| WO | 2015/125281 A1 | | 8/2015 | |
| WO | 2016/174899 A1 | | 11/2016 | |
| WO | WO-2022078725 A1 | * | 4/2022 | |

* cited by examiner

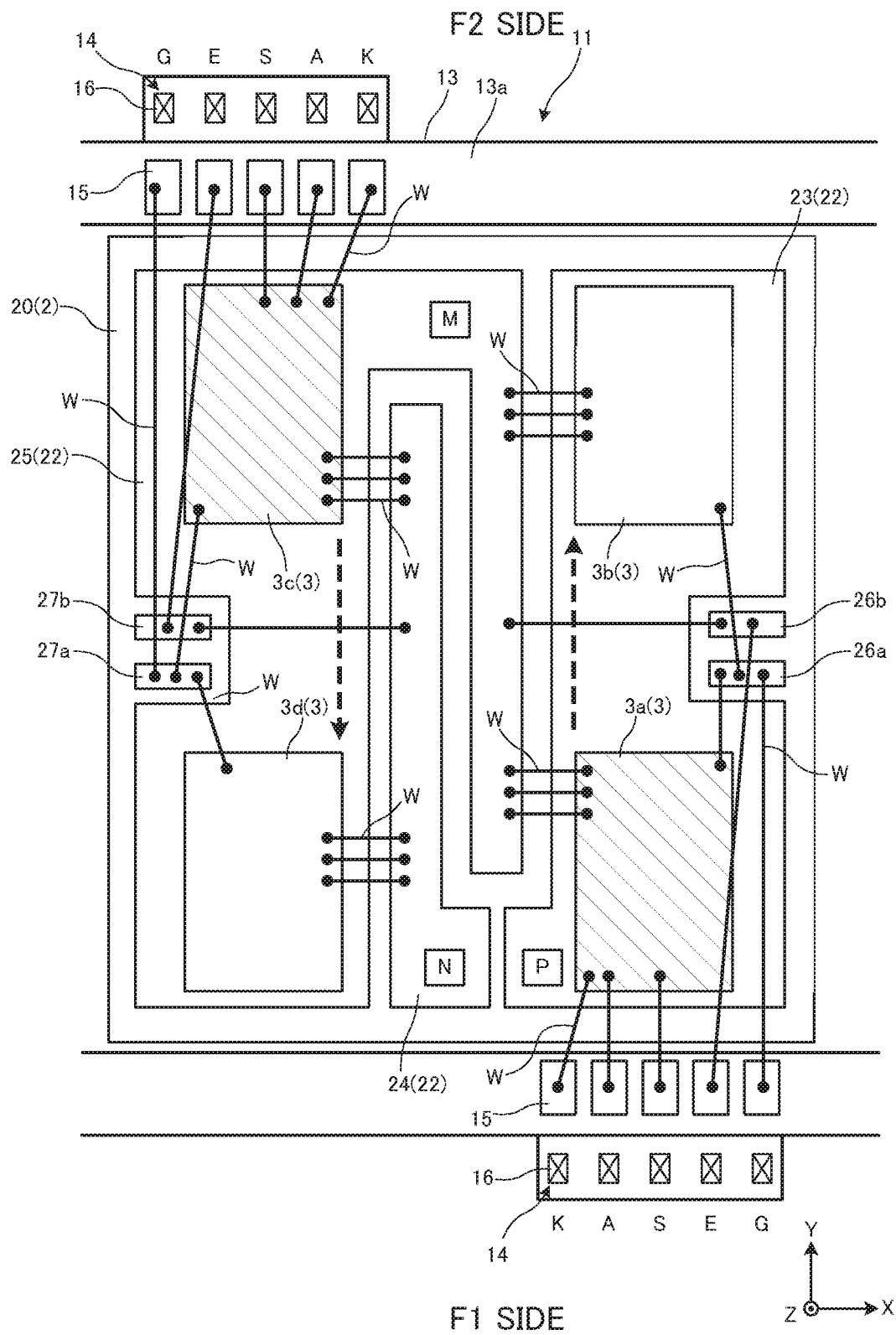

SEMICONDUCTOR MODULE

CROSS REFERENCE TO RELATED APPLICATIONS

This application is based upon and claims the benefit of priority of the prior Japanese Patent Application No. 2019-190626, filed on Oct. 18, 2019, the entire contents of which are incorporated herein by reference.

BACKGROUND OF THE INVENTION

Field of the Invention

The present invention relates to a semiconductor module.

Description of the Related Art

A semiconductor device includes a substrate on which semiconductor elements such as an IGBT (Insulated Gate Bipolar Transistor), a power MOSFET (Metal Oxide Semiconductor Field Effect Transistor), and an FWD (Free Wheeling Diode) are provided, and it is utilized for an inverter device and the like.

The inverter device widely used for driving consumer and industrial motors is configured with semiconductor switching elements (switching elements) such as a MOSFET and an IGBT, and a driving integrated circuit (IC chip) for driving the semiconductor switching elements.

Further, as a way of implementing small-size apparatus and having a protection circuit built therein, there is used an IPM (Intelligent Power Module) in which the switching elements described above and the IC chip are integrated into a single package.

In a conventional semiconductor device (semiconductor module), a thermistor is provided as a temperature sensor for detecting the temperature of the semiconductor element. However, the thermistor is not capable of directly monitoring the chip temperature, so that it is required to do thermal design of the device by considering various kinds of specific variations in products such as variations in the characteristic of the devices and variations in the thermal resistance of the packages. Therefore, there is proposed the so-called semiconductor module with a built-in on-chip sensor, having functions of a temperature sensor, a current sensor, and the like loaded thereon (for example, see International Publication No. WO 2016/174899, International Publication No. WO 2015/125281, and Japanese Patent Laid-Open No. 2007-287988).

In International Publication No. WO 2016/174899, a plurality of semiconductor chips are disposed on a circuit board of an insulating substrate. A temperature detection diode for overheat protection is built-in in each of the semiconductor chips. In International Publication No. WO 2015/125281, a plurality of semiconductor chips are disposed on a drain substrate. Each of the semiconductor chips includes a sense node for drawing a sense current. It is possible to detect a prescribed output voltage from the current flown in the sense node. Further, in Japanese Patent Laid-Open No. 2007-287988, an IGBT with a current sense is disclosed. This type of IGBT includes a current sensing part and a temperature-sensing diode part.

By the way, the semiconductor element with a built-in on-chip sensor described above is expensive. Therefore, if the built-in on-chip sensor type is used for all the semiconductor elements disposed in a module, it may affect the cost of the module as a whole.

The present invention is designed in view of the foregoing issues, and an object thereof is to provide a semiconductor module capable of monitoring the inside temperature with a low-cost configuration.

SUMMARY OF THE INVENTION

A semiconductor module according to an aspect of the present invention includes: a cooler including a first flow passage and a second flow passage disposed in parallel by being isolated from each other, and a third flow passage connecting the first flow passage and the second flow passage; and a laminated substrate loaded on the cooler, the laminated substrate including a plurality of circuit boards provided side by side in a direction intersecting with the third flow passage, wherein the plurality of circuit boards includes a first circuit board connected to a P-terminal, a second circuit board connected to an N-terminal, and a third circuit board connected to an M-terminal, on the first circuit board, a first sensing chip having a sensing function for detecting a temperature and a first non-sensing chip not having the sensing function are loaded side by side along the third flow passage, on the third circuit board, a second sensing chip having the sensing function and a second non-sensing chip not having the sensing function are loaded side by side along the third flow passage, the first sensing chip is disposed by being offset on the second flow passage side, and the second sensing chip is disposed by being offset on the first flow passage side.

According to the present invention, it is possible to monitor the inside temperature in the semiconductor module with a low-cost configuration.

BRIEF DESCRIPTION OF THE DRAWINGS

FIG. 7 is a plan view illustrating a semiconductor module according to a modification example.

DETAILED DESCRIPTION OF THE PREFERRED EMBODIMENTS

Figure 1:
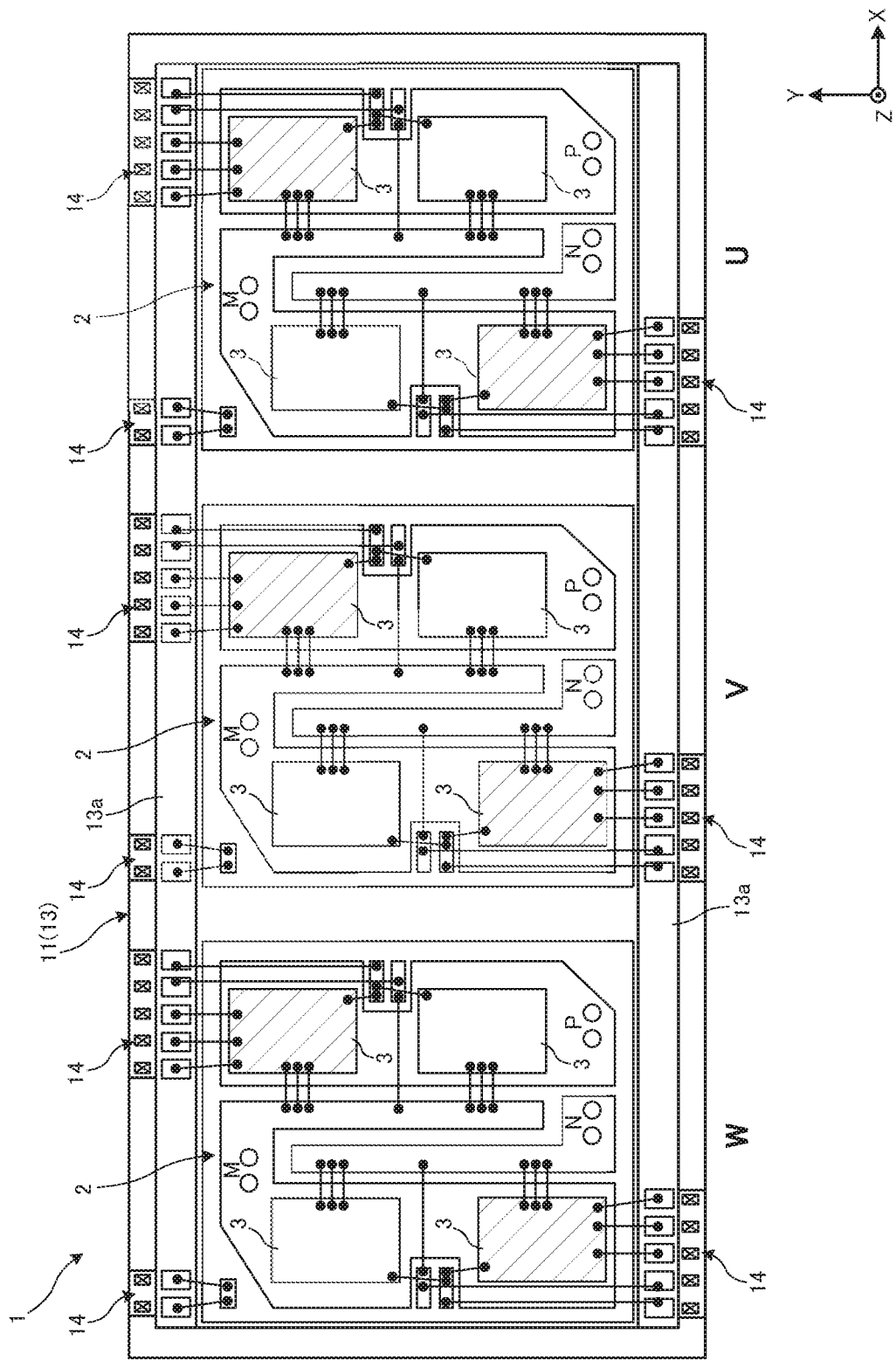
FIG. 1 is a plan view illustrating an example of a semiconductor module according to an embodiment.
Figure 2:
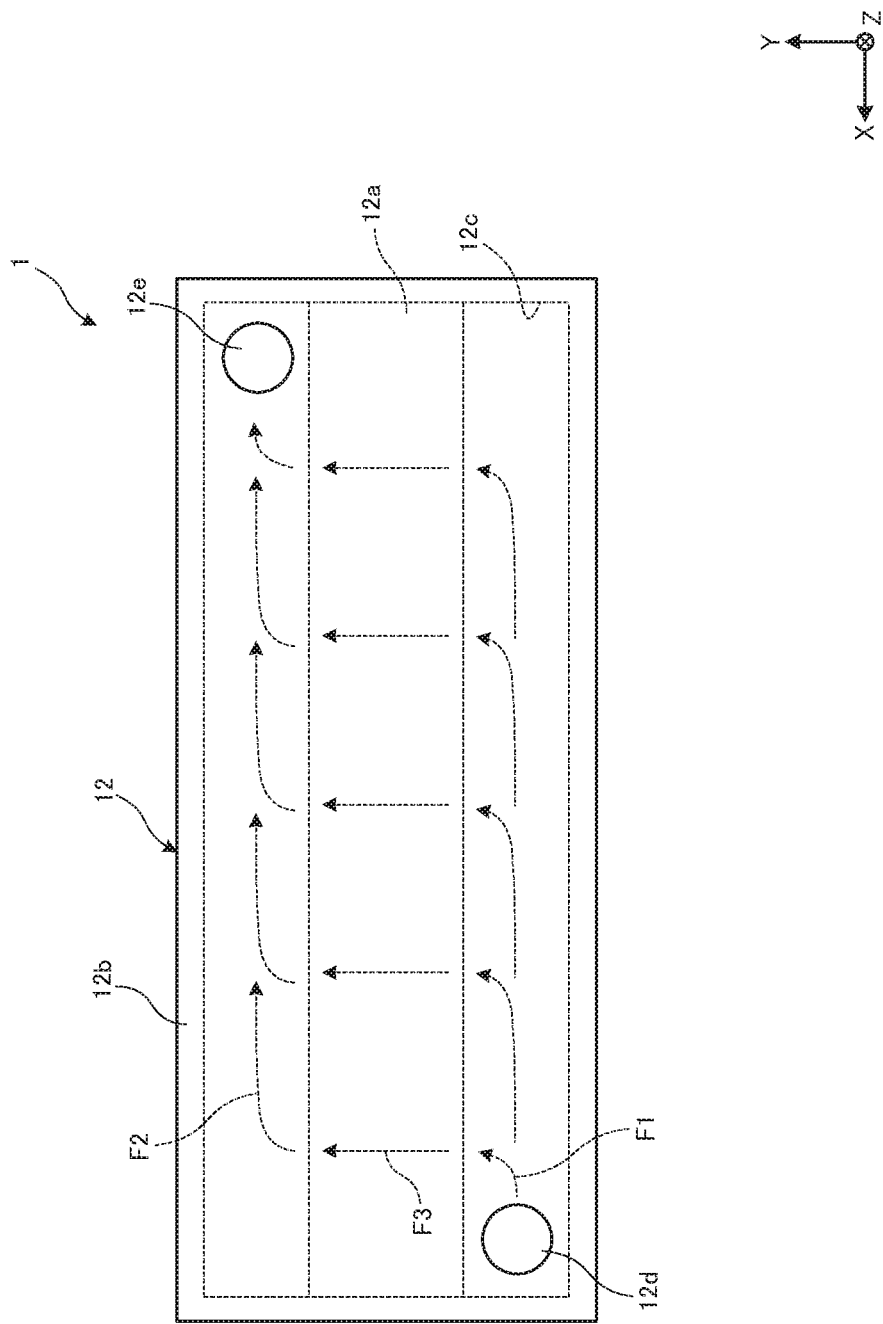
FIG. 2 is a diagram of the semiconductor module of FIG. 1 when viewed from a bottom surface side.
Figure 3:
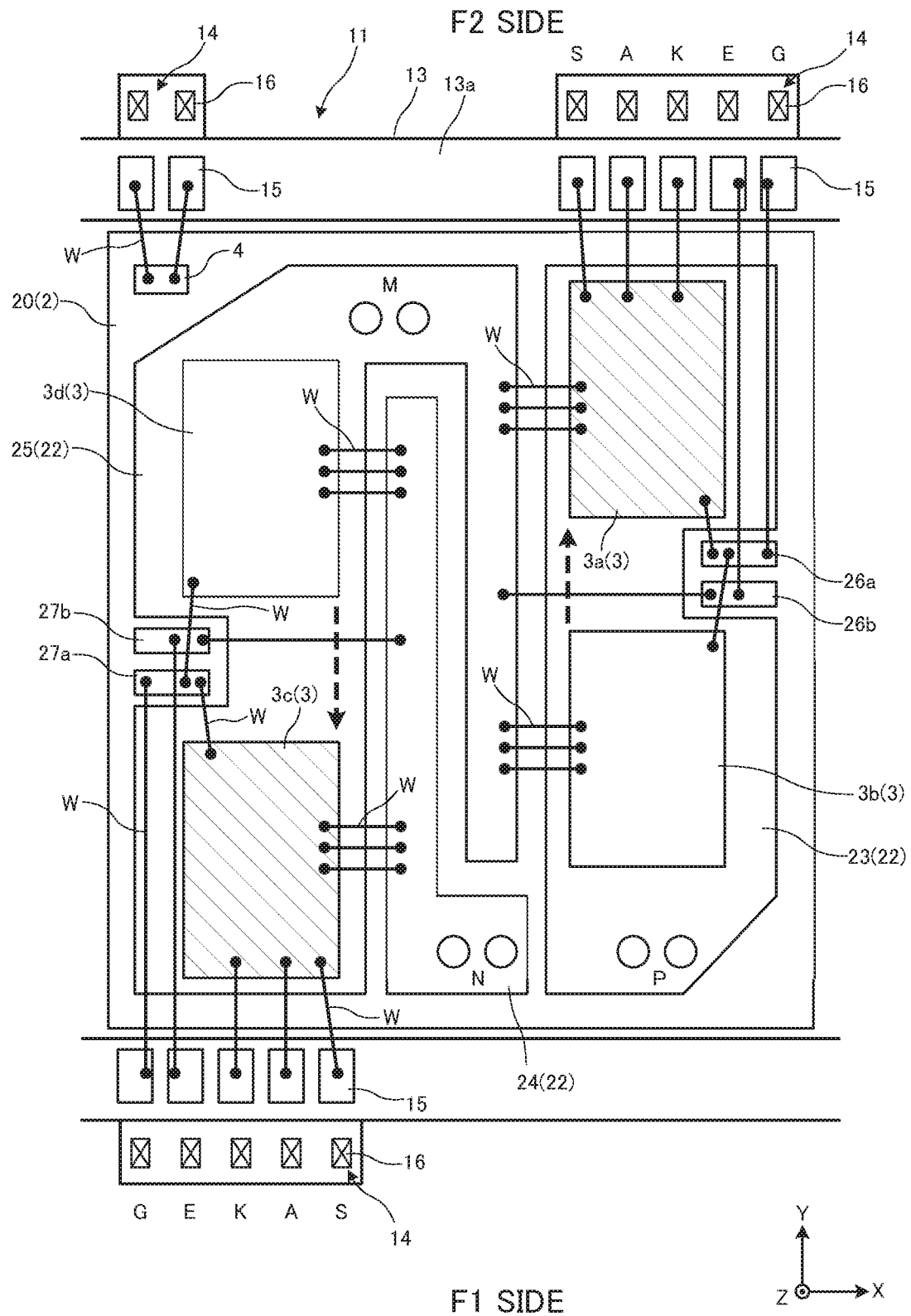
FIG. 3 is a fragmentary enlarged view of a laminated substrate unit illustrated in FIG. 1.
Figure 4:
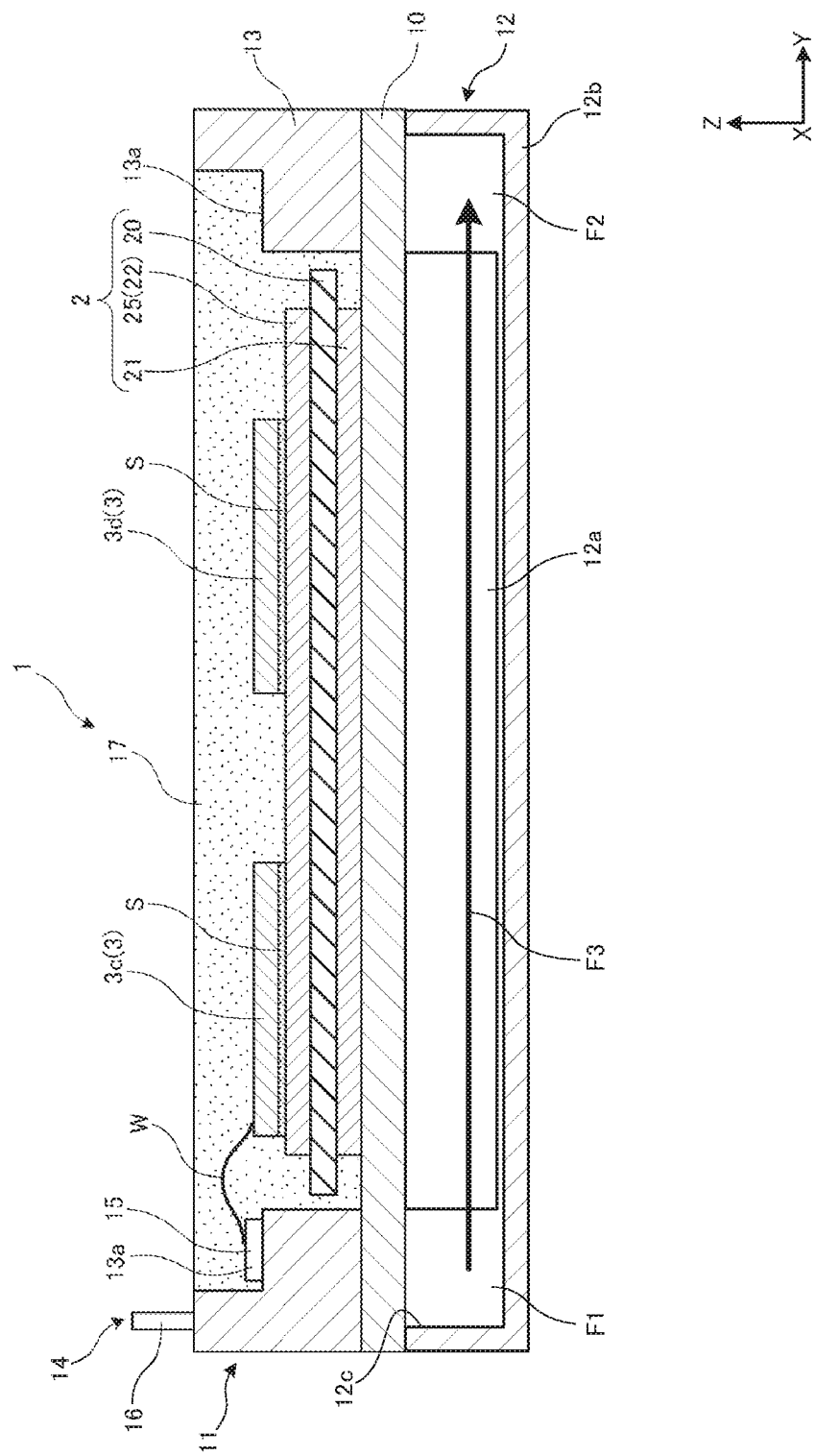
FIG. 4 is a sectional view of the semiconductor module illustrated in FIG. 3 taken along a YZ-plane.
Figure 5:
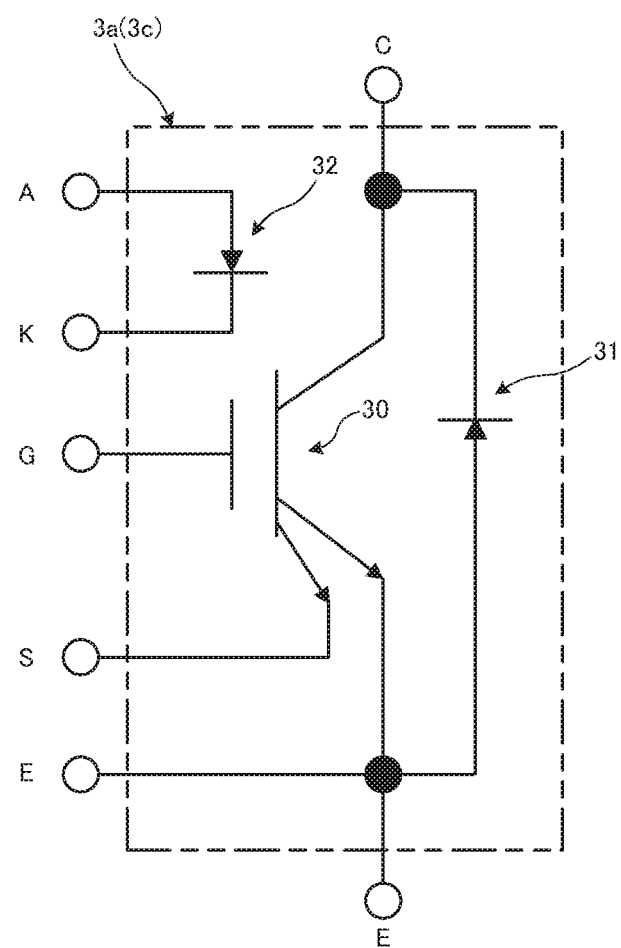
FIG. 5 is an equivalent circuit diagram illustrating a sensing function of a semiconductor element.

Hereinafter, a semiconductor module to which the present invention can be applied will be described. FIG. 1 is a plan view illustrating an example of a semiconductor module according to an embodiment. FIG. 2 is a diagram of the semiconductor module of FIG. 1 when viewed from a bottom surface side. FIG. 3 is a fragmentary enlarged view of a laminated substrate unit illustrated in FIG. 1. FIG. 4 is a sectional view of the semiconductor module illustrated in FIG. 3 taken along a YZ-plane. FIG. 5 is an equivalent circuit diagram illustrating a sensing function of a semiconductor element. Note that the semiconductor module described hereinafter is simply presented as an example, and any modifications can be applied as appropriate without being limited thereto.

Further, in the drawings referred hereinafter, the longitudinal direction (the direction along which a plurality of laminated substrates to be described later are arranged) of the semiconductor module is defined as X-direction, the lateral direction thereof is defined as Y-direction, and the height direction thereof is defined as Z-direction. Illustrated X-, Y-, and Z-axes are orthogonal to each other, and form a right-handed system. Further, in some cases, the X-direction may also be referred to as a left-and-right direction, the Y-direction may also be referred to as a front-and-back direction, and the Z-direction may also be referred to as a top-and-bottom direction. Those directions (front-and-back, left-and-right, and top-and-bottom directions) are terms used for the sake of explanations, and corresponding relations with each of the X-, Y-, and Z-directions may change depending on the installed postures of the semiconductor modules. For example, a heat-dissipation surface side (cooler side) of the semiconductor module will be referred to as a bottom surface side, and an opposite side thereof will be referred to as a top surface side. Further, in this Specification, "plan view" means a case where the top surface of the semiconductor module is viewed from the positive side of the Z-direction.

A semiconductor module 1 is applied to a power conversion device such as a power module, for example. The semiconductor module 1 according to the embodiment is a 6-in-1 type power module configuring an inverter circuit. As illustrated in FIG. 1 to FIG. 4, the semiconductor module 1 is configured with: a base plate 10; a plurality of laminated substrates 2 disposed on the base plate 10; a plurality of semiconductor elements 3 disposed on the laminated substrates 2; a case member 11 that houses the plurality of laminated substrates 2 and the plurality of semiconductor elements 3; and a cooler 12 disposed on a bottom surface of the base plate 10.

The base plate 10 is a rectangular plate with a top surface and a bottom surface. The base plate 10 functions as a heat dissipation plate. Further, the base plate 10 has a rectangular shape that is lengthy in the X-direction on a plan view. The base plate 10 is a metal plate made of copper, aluminum, or an alloy or the like of those, for example, and plating may be applied on the surface thereof.

On the top surface of the base plate 10, the frame-shape case member 11 is disposed. The case member 11 is formed with a synthetic resin, for example, and bonded on the top surface of the base plate 10 via an adhesive (not illustrated). The case member 11 has a rectangular shape fitted to the external shape of the base plate 10, and has an annular wall 13 with an opening formed in the center thereof. The annular wall 13 is formed to rise toward the Z-direction. In the annular wall 13, a plurality of terminal members 14 are provided. The terminal member 14 will be described later.

Further, on the inner side of the annular wall 13, three laminated substrates 2 are disposed side by side along the X-direction on the top surface of the base plate 10. The three laminated substrates 2 configure a U-phase, a V-phase, and a W-phase of an inverter circuit. In the embodiment, there are the U-phase, the V-phase, and the W-phase disposed in this order from the right side when facing the drawing of FIG. 1.

The laminated substrate 2 is formed by laminating a metal layer and an insulating layer, and configured with a DCB (Direct Copper Bonding) substrate, an AMB (Active Metal Brazing) substrate, or a metal base substrate, for example. Specifically, the laminated substrate 2 includes an insulating plate 20, a heat dissipation plate 21 disposed on a bottom surface of the insulating plate 20, and a plurality of circuit boards 22 disposed on the top surface of the insulating plate 20. The laminated substrate 2 is formed substantially in a square shape on a plan view, for example.

The insulating plate 20 has a prescribed thickness in the Z-direction, and formed in a flat-plate shape having a top surface and a bottom surface. The insulating plate 20 is formed, for example, with an insulating material such as a ceramic material such as alumina ($Al_2O_3$), aluminum nitride (AlN), silicon nitride ($Si_3N_4$), a resin material such as epoxy, or an epoxy resin material using a ceramic material as a filler. Note that the insulating plate 20 may also be referred to as an insulating layer or an insulating film.

The heat dissipation plate 21 has a prescribed thickness in the Z-direction, and is formed to cover the entire bottom surface of the insulating plate 20. The heat dissipation plate 21 is formed with a metal plate with fine thermal conductivity, such as copper or aluminum, for example.

On the top surface (main surface) of the insulating plate 20, a plurality of circuit boards 22 are formed in an island form while being electrically isolated from each other. Specifically, the plurality of circuit boards 22 are configured with a first circuit board 23 connected to a positive potential point (P-terminal), a second circuit board 24 connected to a negative potential point (N-terminal), and a third circuit board 25 connected to an intermediate potential point (M-terminal). Those circuit boards 22 are configured with a metal layer of a prescribed thickness formed with a copper foil or the like.

The first circuit board 23 has a rectangular shape on a plan view, which is extended in the Y-direction to go along with a side of the laminated substrate 2 on one side of the X-direction. The first circuit board 23, substantially in the center along the Y-direction, is slightly cut out toward the inner side from the outer side of the X-direction. In the notch part, a gate pad 26a and an emitter pad 26b are formed side by side in the Y-direction. The gate pad 26a is located on the terminal member 14 side (positive side of the Y-direction) of an upper arm.

The second circuit board 24 has a lengthy shape extended in the Y-direction substantially in the center of the laminated substrate 2 in the X-direction. One end of the second circuit board 24 is slightly bent to the X-direction, and forms substantially an L-letter shape on a plan view as a whole.

The third circuit board 25 has substantially an U-letter shape on a plan view, which is extended in the Y-direction to go along with a side of the laminated substrate 2 on the other side of the X-direction, bent to be folded back on the other end side of the second circuit board 24, and then extended in the Y-direction by sandwiching the second circuit board 24 in the Y-direction. The third circuit board 25, substantially in the center along the Y-direction, is slightly cut out toward the inner side from the outer side of the X-direction. In the notch part, a gate pad 27a and an emitter pad 27b are formed side by side in the Y-direction. The gate pad 27a is located on the terminal member 14 side (negative side of the Y-direction) of a lower arm. Those three circuit boards 22 are provided side by side in the direction (X-direction) intersecting with a third flow passage F3 (see FIG. 2) that configures a part of a coolant flow passage to be described later.

At prescribed places on the top surface of the circuit boards 22, a plurality of semiconductor elements 3 are disposed via a bonding material S such as solder (see FIG. 4). The semiconductor element 3 is formed in a square shape on a plan view by a semiconductor substrate of silicon (Si), silicon carbide (SiC), gallium nitride (GaN), or the like. In the embodiment, the semiconductor element 3 is configured with an RC (Reverse Conducting)-IGBT element in which the functions of the IGBT (Insulated Gate Bipolar Transistor) element and the FWD (Free Wheeling Diode) element are integrated.

Note, however, that the semiconductor element 3 is not limited thereto but may be configured by combining a switching element such as the IGBT, a power MOSFET (Metal Oxide Semiconductor Field Effect Transistor), or a BJT (Bipolar Junction Transistor) and a diode such as the FWD (Free Wheeling Diode). Further, as the semiconductor element 3, an RB (Reverse Blocking)-IGBT or the like having sufficient pressure resistance for a reverse bias may be used as well. Further, the shape of the semiconductor element 3, the number thereof to be disposed, the place to be disposed, and the like can be changed as appropriate. The semiconductor element 3 may include, on the semiconductor substrate having a first surface and a second surface on the opposite side of the first surface, an emitter, a source, or an anode electrode on the first surface, a collector, drain, or cathode electrode on the second surface. The semiconductor element 3 as the switching element may include a gate electrode on the first surface of the semiconductor substrate, and may further include a sensing electrode.

In the embodiment, four semiconductor elements 3 are disposed per laminated substrate 2 (per phase). Specifically, two semiconductor elements 3a and 3b disposed on the top surface of the first circuit board 23 configure the upper arm. Further, two semiconductor elements 3c and 3d disposed on the top surface of the third circuit board 25 configure the lower arm. That is, the upper arm and the lower arm are disposed side by side in the X-direction on the top surface of the laminated substrate 2. A chip mount part of the circuit board 23, a wiring member connection part of the circuit board 25, the circuit board 24, and a chip mount part of the circuit board 25 are provided in order in the X-direction.

The two semiconductors configuring each of the upper and lower arms are classified into a sensing chip that has a prescribed sensing function and a non-sensing chip that has no such sensing function. Specifically, the semiconductor elements 3a and 3c are the sensing chips having sensing functions for detecting the chip temperature and the current. In the meantime, the semiconductor elements 3b and 3d are the non-sensing chip not having such sensing functions. That is, each of the upper and lower arms includes one each of the sensing chip and non-sensing chip. Each of the arms may include three or more semiconductor elements each including at least one sensing chip.

In the upper arm, the semiconductor elements 3a and 3b are connected in parallel, and disposed side by side in the Y-direction. Further, in the lower arm, the semiconductor elements 3c and 3d are connected in parallel, and disposed side by side in the Y-direction. In this manner, the sensing chip and the non-sensing chip are disposed side by side in the direction (Y-direction) that is orthogonal to the arranged direction (X-direction) of the upper arm and the lower arm. While the details are to be described later, the sensing chips and the non-sensing chips in the upper arm and the lower arm are disposed inversely. That is, the semiconductor elements 3a and 3c are provided at obliquely opposing positions on a plan view. The semiconductor elements 3a and 3c may be disposed by being isolated on a diagonal line on the laminated substrate 2.

Now, the sensing function of the semiconductor element (sensing chip) will be described by referring to FIG. 5. As illustrated in FIG. 5, the semiconductor elements 3a and 3c include, on the semiconductor substrate, an IGBT element 30, an FWD element 31, and a temperature sensing diode 32.

One end side of the IGBT element 30 is connected to a gate (G), and the other end side thereof is connected to a collector (C), an emitter (E), and a sensing emitter (S). The FWD element 31 is inverse-parallel connected between the emitter and collector of the IGBT element 30.

One end of the temperature sensing diode 32 is connected to an anode (A), and the other end is connected to a cathode (K). The temperature sensing diode 32 detects the chip temperature based on the voltage between the anode and the cathode. The sensing emitter (S) is a terminal capable of shunting and detecting a part of the current flowing in the IGBT. By connecting an external current-sensing resistance, for example, to the sensing emitter (S) and detecting the voltage thereof, it is possible to apply short-circuit protection when there is generated a short-circuit action. The condition of the current-sensing resistance can be set as appropriate when designing a control circuit, so that the voltage value at which the short-circuit protection is started can be set thereby.

Further, on the top surface of the laminated substrate 2, the thermistor 4 is disposed at a corner part located in the vicinity of the semiconductor element 3d of the lower arm. The thermistor 4 detects the temperature of the coolant flowing inside the cooler 12 located on the bottom surface side of the laminated substrate 2. Note that other types of resistance thermometer or thermocouple may be disposed, instead of the thermistor 4.

As described, the frame-shape case member 11 is disposed on the top surface of the laminated substrates 2. The case member 11 has the annular wall 13 that surrounds the periphery of the three laminated substrates 2. On the inner periphery side of the top surface of the annular wall 13, a step part 13a stepping down by one stage is formed. The top surface of the step part 13a is provided at a lower position with respect to the top surface of the annular wall 13.

Further, as illustrated in FIG. 1, in a pair of wall parts of the annular wall 13 opposing in the lateral direction (Y-direction), a plurality of terminal members 14 are embedded by integral molding. The terminal member 14 is formed by folding a plate-like body of a metal material such as a copper material, a copper alloy material, an aluminum alloy material, or an iron alloy material, for example. The terminal member 14 includes an inner-side terminal part 15 exposed on the top surface of the step part 13a, and an outer-side terminal part 16 projected out from the top surface of the annular wall 13.

As illustrated in FIG. 3, the plurality of terminal members 14 are disposed side by side in the X-direction by corresponding to each electrode in the vicinity of the semiconductor elements 3a and 3c having the sensing function. Specifically, in the vicinity of the semiconductor element 3a, five terminal members 14 are disposed side by side in the X-direction. Further, also in the vicinity of the semiconductor element 3c, five terminal members 14 are disposed side by side in the X-direction. As illustrated in FIG. 3, the terminal members 14 disposed in a unit of five are in an obliquely opposing positional relation by sandwiching the laminated substrate 2 in the Y-direction on a plan view. In the diagonal-line direction of the laminated substrate 2, the terminal members 14 for the upper arm are provided neighboring to the semiconductor element 3a, while the terminal members 14 for the lower arm are provided neighboring to the semiconductor element 3c. The sensing electrodes (S, A, K) of the semiconductor element 3a and the sensing electrodes (S, A, K) of the semiconductor element 3c may be disposed by being isolated in the Y-direction in the diagonal-line direction of the laminated substrate 2. The terminal members 14 for the upper arm and the sensing electrodes of the semiconductor element 3a may be electrically connected via wiring members W. The terminal members 14 for the lower arm and the sensing electrodes of the semiconductor element 3c may be electrically connected via the wiring members W. In the semiconductor element 3a, the gate electrode may be disposed on the opposite side of the sensing electrode. In the semiconductor element 3c, the gate electrode may be disposed on the opposite side of the sensing electrode. Further, in the annular wall 13 located in the vicinity of the thermistor 4, the terminal members 14 are also disposed. As illustrated in FIG. 1, those terminal members 14 are disposed in the same manner in each of the phases.

Each of the semiconductor elements 3, the circuit boards 22, and the terminal members 14 are electrically connected via the wiring members W. For example, in the upper arm, the semiconductor element 3a and the inner-side terminal part 15, the semiconductor element 3a and the third circuit board 25, the semiconductor element 3a and the gate pad 26a, the gate pad 26a and the terminal member 14 on the gate side, the third circuit board 25 and the emitter pad 26b, and the emitter pad 26b and the terminal member 14 on the emitter side are connected, respectively, via the wiring members W. Further, the semiconductor 3b and the third circuit board 25 as well as the semiconductor element 3b and the gate pad 26a are also connected, respectively, via the wiring members W. The gate electrode of the semiconductor element 3b may be disposed in the vicinity of the gate electrode of the semiconductor element 3a with the gate pad 26a interposed therebetween. The intermediate potential of the semiconductor elements 3a and 3b connected in parallel may be detected by connecting the third circuit board 25 and the emitter pad 26b via the wiring member W disposed between the semiconductor elements 3a and 3b.

In the lower arm, the semiconductor element 3c and the inner-side terminal part 15, the semiconductor element 3c and the second circuit board 24, the semiconductor element 3d and the gate pad 27a, the gate pad 27a and the terminal member 14 on the gate side, the second circuit board 24 and the emitter pad 27b, and the emitter pad 27b and the terminal member 14 on the emitter side are connected, respectively, via the wiring members W. Further, the semiconductor 3d and the second circuit board 24 as well as the semiconductor element 3d and the gate pad 27a are also connected, respectively, via the wiring members W. The gate electrode of the semiconductor element 3d may be disposed in the vicinity of the gate electrode of the semiconductor element 3c with the gate pad 27a interposed therebetween. The intermediate potential of the semiconductor elements 3c and 3d connected in parallel may be detected by connecting the second circuit board 24 and the emitter pad 27b via the wiring member W disposed between the semiconductor elements 3c and 3d.

Further, the thermistor 4 and the inner-side terminal part 15 are also connected via the wiring member W. For those wiring members W, conductor wires (bonding wires) are used. As the material of the conductor wire, it is possible to use one of or a combination of gold, copper, aluminum, a gold alloy, a copper alloy, and an aluminum alloy. Further, as the wiring member, it is also possible to use a member other than the conductor wire. For example, a ribbon may be used as the wiring member.

Further, into the inside space of the case member 11 defined by the annular wall 13, a sealing resin 17 is filled. The sealing resin 17 is filled such that the top surface thereof reaches the top surface of the annular wall 13, for example. Thereby, the laminated substrates 2, the semiconductor elements 3, the inner-side terminal parts 15, and the wiring members W are sealed. Note that it is possible to use an epoxy resin or silicone gel for the sealing resin 17.

As illustrated in FIG. 2 and FIG. 4, the cooler 12 is configured including the base plate 10 described above and a plurality of fins 12a provided on the bottom surface side of the base plate 10. The cooler 12 may further include a cooling case 12b. As described above, the base plate 10 functions as a heat dissipation plate, and the plurality of laminated substrates 2 are mounted on the top surface thereof. The plurality of fins 12a provided on the bottom surface (heat dissipation surface) of the base plate 10 are housed in a recessed part 12c formed in the cooling case 12b. Note that the cooling case 12b may also be referred to as a coolant jacket or a water jacket.

The plurality of fins 12a are provided integrally on the bottom surface of the base plate 10. The fins 12a may be formed with a same metal material as that of the base plate 10. The fins 12a are used as the heat dissipation plate, in other words, as a heat sink. For example, as the fins 12a, it is possible to use a pin fin in which a plurality of prismatic pins (square pins) are arranged at a prescribed pitch with a space provided therebetween. The configuration of the fins 12a is not limited thereto, but modifications are possible as appropriate. For example, it is possible to employ a configuration in which cylindrical pins are provided instead of prismatic pins or a configuration in which a plurality of blade-shape fins extending in Y-direction are arranged in parallel to each other. The fins 12a are provided to be able to have the coolant flow in the Y-direction.

In the base plate 10, the area where the plurality of fins 12a are to be provided is preferable to include the area on the opposite side (back surface side) of the mount area of the semiconductor elements 3 on the laminated substrates 2 in a state where the plurality of laminated substrates 2 are bonded on the base plate 10. In other words, the area where the plurality of fins 12a are integrally provided on the base plate 10 is preferable to be the area including the area directly under the semiconductor elements 3. In the embodiment, in the area including the area directly under the plurality of laminated substrates 2, the plurality of fins 12a are disposed. Further, in the embodiment, an aggregate of the plurality of fins 12a has a substantially cuboid shape. The longitudinal direction of the aggregate of the plurality of fins 12a coincides with the longitudinal direction (X-direction) of the semiconductor module 1.

The cooling case 12b has a substantially cuboid external shape, which is a rectangular shape lengthy in the X-direction on a plan view. The external shape of the cooling case 12b on a plan view is substantially the same shape as the external shape of the base plate 10. The cooling case 12b has the recessed part 12c formed in the top surface thereof. Thereby, the cooling case 12b is formed in a box type with an open upper side. The recessed part 12c has a rectangular shape on a plan view, which is a similar shape with the external shape of the cooling case 12b.

The recessed part 12c is formed to be larger than the external shape of the aggregate of the plurality of fins 12a. More specifically, the width of the recessed part 12c in the Y-direction is set to be sufficiently larger than the width of the aggregate of the plurality of fins 12a in the Y-direction. Further, the aggregate of the plurality of fins 12a is disposed in the center of the recessed part 12c in the Y-direction. As described above, the recessed part 12c houses the plurality of fins 12a. A gap provided between the recessed part 12c and the plurality of fins 12c demarcates a coolant flow passage, so that the coolant can flow in the flow passage.

Specifically, as illustrated in FIG. 2, the coolant flow passage is configured with: a first flow passage F1 provided within the recessed part 12c on the negative side of the Y-direction of the plurality of fins 12c; a second flow passage F2 provided within the recessed part 12c on the positive side of the Y-direction of the plurality of fins 12c; and a flow passage F3 provided in the gaps of the plurality of fins 12c. The first flow passage F1 and the second flow passage F2 are disposed in parallel by being isolated from each other in the Y-direction. The third flow passage F3 is provided between the first flow passage F1 and the second flow passage F2, and connects the first flow passage F1 and the second flow passage F2. The first flow passage F1 and the second flow passage F2 are extended in the X-direction, whereas the third flow passage F3 is extended in the Y-direction. The coolant supplied from an external device such as a pump can circulate in a cooling system by passing through the first flow passage F1, the third flow passage F3, and the second flow passage F2. The coolant may pass through the third flow passage from the first flow passage F1 toward the second flow passage F2.

Further, the cooling case 12b is provided with an introduction port 12d and a discharge port 12e as the outlet and inlet of the coolant. As illustrated in FIG. 2, the introduction port 12d is disposed to communicate with the end of the first flow passage F1 on the positive side of the X-direction in the bottom wall part of the cooling case 12b. The discharge port 12e is disposed to communicate with the end of the second flow passage F2 on the negative side of the X-direction in the bottom wall part of the cooling case 12b. That is, the introduction port 12d and the discharge port 12e are disposed to obliquely oppose to each other by sandwiching the plurality of fins 12a. Note that the introduction port 12d and the discharge port 12e may be provided in the sidewall parts of the cooling case 12b.

In the embodiment, the coolant is introduced from the introduction port 12d into the cooling case 12b, flown from the first flow passage F1 further into the second flow passage F2 through the third flow passage F3, and discharged to the outside the cooling case 12b from the discharge port 12e. Arrangement of the introduction port 12d and the discharge port 12e is not limited thereto, but may be changed as appropriate. For example, the positional relation of the introduction port 12d and the discharge port 12e may be inversed. That is, the coolant flow passage may be configured such that the coolant is flown from the second flow passage F2 further into the first flow passage F1 through the third flow passage F3.

While it is described in the embodiment to include the cooling case 12b as a component of the cooler 12, the cooling case 12b may be considered an optional component. That is, the cooler 12 may be configured only with the base plate 10 and the plurality of fins 12a.

By the way, an in-vehicle power semiconductor module is configured including mainly a semiconductor element, an insulating substrate (laminated substrate), a cooler, and the like. For the semiconductor element, an RC-IGBT in which an IGBT element and an FWD element are integrated is employed. By including the cooler mounted into the module, reduction in the size and weight of the entire module is achieved while increasing the cooling performance. Further, in this type of semiconductor module, there is formed a two-parallel-structure circuit in which two chips are connected in parallel in each of the upper and lower arms in order to have a flow of a large current. One of the two-parallel chips has a temperature sensing function for monitoring the chip temperature and a current sensing function for detecting abnormality of the current.

Figure 6:
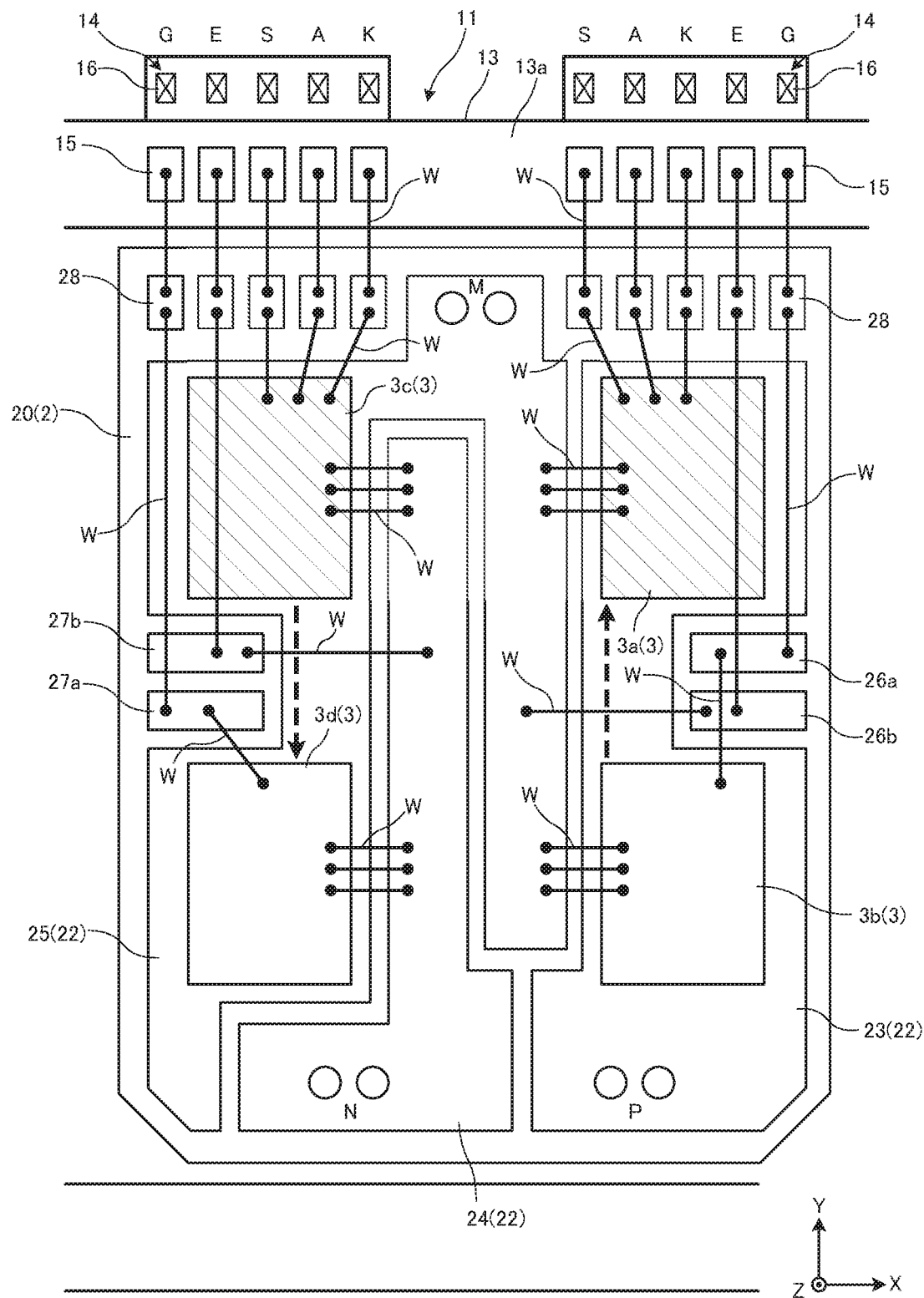
FIG. 6 is a schematic plan view of a semiconductor module according to a reference example.

Now, a configuration of a conventional semiconductor module will be described by referring to a reference example. FIG. 6 is a schematic plan view of the semiconductor module according to the reference example. In FIG. 6, layout of the semiconductor elements 3, the terminal members 14, and a part of the circuit boards 22 is different from that of FIG. 2. Therefore, same names and reference signs are applied to the components in common to those of FIG. 2 and explanations thereof are omitted as appropriate.

As illustrated in FIG. 6, in the upper arm, the semiconductor elements 3a and 3b are connected in parallel and disposed on the top surface of the first circuit board 23 side by side in the Y-direction. Further, in the lower arm, the semiconductor elements 3c and 3d are connected in parallel and disposed on the top surface of the third circuit board 25 side by side in the Y-direction. In this manner, the sensing chip and the non-sensing chip are disposed side by side in the direction (Y-direction) that is orthogonal to the arranged direction (X-direction) of the upper arm and the lower arm. Further, in the upper arm and the lower arm, the sensing chip and the non-sensing chip are provided on the same side of the Y-direction. That is, the semiconductors 3a and 3c are disposed by being offset on one side of the Y-direction along a side of the laminated substrate 2, and are also disposed to oppose to each other in the X-direction.

Further, in the upper arm, the gate pad 26a and the emitter pad 26b are formed side by side in the Y-direction on the top surface of the laminated substrate 2 located between the semiconductor elements 3a and 3b. Similarly, in the lower arm, the gate pad 27a and the emitter pad 27b are formed side by side in the Y-direction on the top surface of the laminated substrate 2 located between the semiconductor elements 3c and 3d. In FIG. 6, the emitter electrode (E) on the upper arm side is connected to the emitter pad 26b on the insulating plate 20 via the wiring member W. Further, the emitter electrode (E) on the lower arm side is connected to the emitter pad 27b on the insulating plate 20 via the wiring member W.

Further, on the top surface of the laminated substrate 2, a plurality of electrode pads 28 are formed by corresponding to each of the electrodes of the semiconductor elements 3a and 3c on the outer side of the semiconductor elements 3a and 3c in the Y-direction. Specifically, five electrode pads 28 are disposed side by side in the X-direction on the sideway of the semiconductor element 3a, and five electrode pads 28 are disposed side by side in the X-direction on the sideway of the semiconductor element 3c.

Further, in the annular wall 13, the plurality of terminal members 14 are embedded by integral molding by corresponding to each of the electrodes of the semiconductor elements 3a and 3c. Specifically, the plurality of terminal members 14 are disposed in the wall part on one side of the lateral direction (Y-direction) of the annular wall 13. On a further sideway of the five electrode pads 28 disposed on the sideway of the semiconductor element 3a, five terminal members 14 are disposed side by side in the X-direction. Also, on a further sideway of the five electrode pads 28 disposed on the sideway of the semiconductor element 3c, five terminal members 14 are disposed side by side in the X-direction.

In general, in each of the upper and lower arms, out of the two semiconductor elements connected in parallel, the semiconductor element located on the front side (upstream side) with respect to the flowing direction of the current is considered to have a larger load. For example, the current in the upper arm flows from the P-terminal toward the M-terminal, and the current in the lower arm flows from the M-terminal toward the N-terminal. In the reference example described above, the semiconductor elements 3a and 3c having the sensing functions are disposed by being offset on one side of the Y-direction, so that only the temperature on one side of the Y-direction of the semiconductor module can be detected. For example, it may not be able to appropriately control the temperature in a case where the temperature of the semiconductor elements 3b and 3d which have no sensing functions and are located on the other side of the Y-direction becomes higher than the temperature of the semiconductor elements 3a and 3c.

Therefore, the inventors of the present invention have come to design the present invention by paying attention to the positional relation between the sensing chips having the sensing functions and the non-sensing chips not having the sensing functions and the flowing direction of the coolant (cooling water) flowing in the cooler integrated with the module.

That is, the main point of the present invention is to dispose the sensing chip and the non-sensing chip on the lower arm side inversely with respect to those of a conventional case and the arranged direction of the sensing chip and the non-sensing chip coincides with the flowing direction of the coolant.

Specifically, in the embodiment, as illustrated in FIG. 3, the plurality of semiconductor elements 3 configuring the upper arm and the lower arm are disposed laterally on the top surface of the laminated substrate 2. The plurality of semiconductor elements are configured by disposing the sensing chips (semiconductor elements 3a, 3c) having the sensing functions for detecting the temperature and the non-sensing chips (semiconductor elements 3b, 3d) not having the sensing functions side by side in the direction (Y-direction) that is orthogonal to the arranged direction (X-direction) of the upper arm and the lower arm. Further, in the upper arm and the lower arm, the sensing chips and the non-sensing chips are disposed inversely. That is, the semiconductor elements 3a and 3c are disposed to obliquely oppose to each other on a plan view, which are provided on a diagonal line on the laminated substrate 2. Further, the flowing direction of the coolant flowing in the cooler 12 coincides with the arranged direction of the sensing chip and the non-sensing chip.

In other words, on the first circuit board 23, the semiconductor element 3a as a first sensing chip having the sensing function for detecting the temperature and the semiconductor element 3b as a first non-sensing chip not having the sensing function are loaded side by side along the third flow passage F3. Further, on the third circuit board 25, the semiconductor element 3c as a second sensing chip having the sensing function and the semiconductor element 3d as a second non-sensing chip not having the sensing function are loaded side by side along the third flow passage F3. Further, the semiconductor element 3a is disposed by being offset on the second flow passage F2 side, and the semiconductor element 3c is disposed by being offset on the first flow passage F1 side. Further, the P-terminal is disposed by being offset on the first flow passage F1 side on the first circuit board 23, and the M-terminal is disposed by being offset on the second flow passage F2 side on the third circuit board 25. The first flow passage F1 has the introduction port 12d, and the second flow passage F2 has the discharge port 12e.

With such configuration, by combining the sensing chip and the non-sensing chip, it is possible to manufacture the module at a lower cost compared to a case where the entire semiconductor elements within the module are configured with the sensing chips. Further, since the sensing chips and the non-sensing chips are disposed alternately in the upper arm and the lower arm, the sensing chips are not to be disposed by being offset on one side of the Y-direction of the semiconductor module 1. Further, by setting the flowing direction of the coolant flowing in the cooler 12 to coincide with the arranged direction (Y-direction) of the sensing chip and the non-sensing chip, it becomes possible to appropriately detect the temperature of the semiconductor elements on both the upstream side and the downstream side of the cooler 12. Therefore, the temperature of the non-sensing chip not having the sensing function can be estimated from the nearby sensing chip, so that it is possible to achieve the temperature control more effectively. As described, it is possible to detect the chip temperature with a low-cost configuration even with the semiconductor element not having the sensing function.

In the embodiment, there is no element corresponding to the pads 28 illustrated in FIG. 6 of the reference example. Therefore, the semiconductor element 3a and the semiconductor element 3d can be disposed by being shifted to the outer side in the Y-direction for the space of the pads 28. That is, the semiconductor element 3a is disposed closer to the second flow passage F2 side than the semiconductor element 3d, and the semiconductor element 3c is disposed closer to the first flow passage F1 side than the semiconductor element 3b. Thereby, in the flowing direction (third flow passage F3) of the coolant flowing directly under the semiconductor elements 3, the distance between the semiconductor elements 3a and 3c can be secured and the change in the temperature of the coolant can be easily monitored.

In the embodiment, the sensing chip has not only the temperature sensing function but also the current sensing function. With such configuration, it is possible to detect short-circuit by the current sensing function. While the sensing chip is configured to include both the temperature sensing function and the current sensing function in the embodiment, the configuration is not limited thereto. It is not essential to have the current sensing function.

While the terminal members 14 and the semiconductor elements 3 are electrically connected via each of the electrode pads 28 on the insulating plate 20 in the reference example, the terminal members 14 and the semiconductor elements 3 are directly connected via the wiring members W in the embodiment. With such configuration, each of the electrode pads 28 can be omitted. Therefore, the area of the laminated substrate 2 can be reduced, so that it is possible to reduce the size of the entire module and to cut the cost.

In the embodiment, the plurality of terminal members 14 are provided in the upper arm and the lower arm, respectively. On a plan view, the plurality of terminal members 14 in the upper arm and the lower arm are disposed to obliquely oppose to each other by sandwiching the laminated substrate 2. With such configuration in which the plurality of terminal members 14 obliquely oppose to each other in the Y-direction, it is possible to stably hold a control board (printed board) with the plurality of opposing terminal members 14 when mounting the control board disposed on the top surface of the module. On the control board, a driving integrated circuit for controlling switching elements may be mounted.

While not specifically illustrated, the control board is configured with a printed board in a rectangular shape on a plan view lengthy in the X-direction, which corresponds to the external shape of the semiconductor module 1. In the control board, through-holes corresponding to the outer-side terminal parts 16 of each of the terminal members 14, for example, are formed. By inserting the tips of the outer-side terminal parts 16 into the through-holes, the control board is disposed at a prescribed place of the semiconductor module 1.

In the reference example, the terminal members 14 are disposed only on one side of the Y-direction. Thus, even when the control board is disposed, the other side of the Y-direction is not supported. Therefore, in the reference example, it is not possible to stably hold the control board. Thus, in the reference example, it is necessary to separately form a support part in the case member 11 (annular wall 13) for supporting the control board, thereby complicating the configuration.

In the embodiment, the thermistor 4 is disposed on the top surface of the laminated substrate 2 (insulating plate 20). With such configuration, it is possible to detect the temperature of the coolant flown underneath the laminated substrate 2 by the thermistor 4. Note that the thermistor 4 is preferable to be disposed on the downstream side of the flowing direction of the coolant. This makes it possible to detect the temperature of the coolant warmed by the heat of the semiconductor elements 3.

As described above, according to the present invention, the sensing chip and the non-sensing chip on the lower arm side are disposed inversely with respect to those of a conventional case and the arranged direction of the sensing chip and the non-sensing chip coincides with the flowing direction of the coolant, thereby making it possible to detect the chip temperature with a low-cost configuration even with the semiconductor element not having the sensing function.

In the embodiment described above, the number of the semiconductor elements 3 disposed on the laminated substrate 2 and the disposing places thereof are not limited to the configuration described above, but may be changed as appropriate.

Further, in the embodiment described above, the number of the circuit boards 22 and the layout thereof are not limited to the configuration described above, but may be changed as appropriate.

Further, while the semiconductor elements 3 are formed in a rectangular shape on a plan view in the embodiment described above, the configuration is not limited thereto. The semiconductor elements 3 may be formed in a polygonal shape other than the rectangular shape.

Further, while the upper arm and the lower arm for one phase are configured with two each of the semiconductor elements connected in parallel in the embodiment described above, there are three or more semiconductor elements connected in parallel. Further, as for the number of phases of the semiconductor module 1, there may be a single phase, three phases, or still more phases.

Further, while the case where the sensing chip is disposed on the downstream side of the current flowing direction with respect to the non-sensing chip both in the upper arm and the lower arm is described in the embodiment above, the configuration is not limited thereto. The positional relation of the sensing chip and the non-sensing chip may be inverted in both the upper arm and the lower arm such that the sensing chip is disposed on the upstream side of the current flowing direction with respect to the non-sensing chip. For example, arrangement illustrated in FIG. 7 is possible. FIG. 7 is a plan view illustrating a semiconductor module according to a modification example. FIG. 7 is different from FIG. 3 in respect that arrangement of the semiconductor elements 3a, 3b, arrangement of the semiconductor elements 3c, 3d, and arrangement of the plurality of terminal members 14 are inverted, respectively. Thus, only the major different points will be described, and same reference signs are applied to the common components and explanations thereof are omitted as appropriate.

As illustrated in FIG. 7, on the first circuit board 23, the semiconductor element 3a as the first sensing chip having the sensing function for detecting the temperature and the semiconductor element 3b as the first non-sensing chip not having the sensing function are loaded side by side along the third flow passage F3. Further, on the third circuit board 25, the semiconductor element 3c as the second sensing chip having the sensing function and the semiconductor element 3d as the second non-sensing chip not having the sensing function are loaded side by side along the third flow passage F3. Further, the semiconductor element 3a is disposed by being offset on the first flow passage F1 side, and the semiconductor element 3c is disposed by being offset on the second flow passage F2 side. Further, the P-terminal is disposed by being offset on the first flow passage F1 side on the first circuit board 23, and the M-terminal is disposed by being offset on the second flow passage F2 side on the third circuit board 25. In the modification example illustrated in FIG. 7, the first flow passage F1 and the second flow passage F2 may be switched with respect to the third flow passage F3. In that case, the coolant may be flown from the M-terminal side to the P-terminal side in the flow passage F3.

With such configuration, like the configuration of FIG. 3, it is possible to secure the distance between the semiconductor elements 3a and 3c in the flowing direction (third flow passage F3) of the coolant flowing directly under the semiconductor elements 3 and to easily monitor the change in the temperature of the coolant. Especially, for the flowing direction of the current illustrated by a broken arrow of FIG. 7, the semiconductor elements 3a and 3c can be disposed on the upstream side. Thereby, it is possible to monitor the temperature of the semiconductor elements 3a and 3c on the upstream side of the current flowing direction considered to have a larger load. The semiconductor elements 3a, 3c may be provided near the P-terminal and the M-terminal, and the semiconductor elements 3b, 3d may be provided far therefrom.

In the embodiment described above, the flowing direction of the coolant flowing in the cooler 12 is directed toward the Y-direction. In this case, the introduction port and the discharge port of the coolant may be on any sides of the Y-direction. That is, it is not an issue as to which side of the Y-direction is the upstream side or the downstream side. For example, the side where the thermistor 4 described above is disposed may be defined as the discharge side (downstream side) of the coolant.

While the embodiment and the modification example have been described, a combination of a whole part of or a part of the embodiment and the modification example may be employed as another embodiment.

In the modes illustrated in FIG. 3 and FIG. 7, the semiconductor chip 3a (sensing chip) for the upper arm and the semiconductor chip 3c (sensing chip) for the lower arm are provided by being isolated in the circulating direction of the coolant and adjacent to the opposite corners of the laminated substrate 2, respectively. With such arrangement, it is possible to monitor the temperature inside the module by the sensing chips isolated on the upstream side and the downstream side of the coolant. In both of the modes, the terminal members 14 connected to the semiconductor chip 3a for the upper arm and the terminal members 14 connected to the semiconductor chip 3c for the lower arm may also be provided by being isolated in the circulating direction of the coolant and adjacent to the opposite corners of the laminated substrate 2. By such arrangement of the terminal members 14, the control board can be stably held. Further, as in the mode illustrated in FIG. 7, on the laminated substrate 2, the semiconductor chip 3a and the terminal members 14 for the upper arm may be provided on the P-terminal side, and the semiconductor chip 3c and the terminal members 14 for the lower arm may be provided on the M-terminal side. With such arrangement, the temperature within the module can be monitored by the sensing chips of a relatively larger load regardless of the circulating direction of the coolant.

Further, the present invention is not limited to the embodiment and the modification example described above, but various changes, substitutions, and modifications are possible without departing from the scope of the technical spirit. Further, as long as the technical spirit can be achieved by means of another method by a technical progress or another technique derived therefrom, such method may be used as well. Therefore, the scope of the appended claims covers all embodiments that can be included within the scope of the technical spirit.

Hereinafter, the feature points of the embodiments described above will be described.

The semiconductor module described in the embodiment includes: a cooler including a first flow passage and a second flow passage disposed in parallel by being isolated from each other, and a third flow passage connecting the first flow passage and the second flow passage; and a laminated substrate loaded on the cooler, the laminated substrate including a plurality of circuit boards provided side by side in a direction intersecting with the third flow passage, wherein the plurality of circuit boards includes a first circuit board connected to a P-terminal, a second circuit board connected to an N-terminal, and a third circuit board connected to an M-terminal, on the first circuit board, a first sensing chip having a sensing function for detecting a temperature and a first non-sensing chip not having the sensing function are loaded side by side along the third flow passage, on the third circuit board, a second sensing chip having the sensing function and a second non-sensing chip not having the sensing function are loaded side by side along the third flow passage, the first sensing chip is disposed by being offset on the second flow passage side, and the second sensing chip is disposed by being offset on the first flow passage side.

Further, in the semiconductor module described in the embodiment, the first sensing chip and the second sensing chip further have a current sensing function for detecting short-circuit.

Further, the semiconductor module described in the embodiment further includes a case member that houses the laminated substrate, and includes a first terminal member and a second terminal member, wherein: the first sensing chip and the first terminal member are connected via a first wiring member; and the second sensing chip and the second terminal member are connected via a second wiring member.

Further, in the semiconductor module described in the embodiment: the terminal members are provided on the first sensing chip side and the second sensing chip side, respectively; and the terminal member provided on the first sensing chip side and the terminal member provided on the second sensing chip side are disposed to obliquely oppose to each other by sandwiching the laminated substrate on a plan view.

Further, the semiconductor module described in the embodiment includes a thermistor disposed on a top surface of the laminated substrate.

Further, in the semiconductor module described in the embodiment: the P-terminal is disposed by being offset on the first flow passage side on the first circuit board; and the M-terminal is disposed by being offset on the second flow passage side on the third circuit board.

Further, in the semiconductor module described in the embodiment: the P-terminal is disposed by being offset on the second flow passage side on the first circuit board; and the M-terminal is disposed by being offset on the first flow passage side on the third circuit board.

Further, in the semiconductor module described in the embodiment, an introduction port is provided to the first flow passage, and a discharge port is provided to the second flow passage.

INDUSTRIAL APPLICABILITY

As described above, the present invention exhibits an advantage of being able to monitoring the inside temperature with a low-cost configuration and is effective for the semiconductor module in particular.

REFERENCE SIGNS LIST

1 Semiconductor module
2 Laminated substrate
3 Semiconductor element
3a Semiconductor element (first sensing chip)
3b Semiconductor element (first non-sensing chip)
3c Semiconductor element (second sensing chip)
3d Semiconductor element (second non-sensing chip)
4 Thermistor
10 Base plate
11 Case member
12 Cooler
12a Fin
12b Cooling case
12c Recessed part
12d Introduction port
12e Discharge port
13 Annular wall
13a Step part
14 Terminal member
15 Inner-side terminal part
16 Outer-side terminal part
17 Sealing resin
20 Insulating plate
21 Heat dissipation plate
22 Circuit board
23 First circuit board
24 Second circuit board
25 Third circuit board
26a Gate pad
26b Emitter pad
27a Gate pad
27b Emitter pad
28 Electrode pad
30 IGBT element
31 FWD element
32 Temperature sensing diode
F1 First flow passage (coolant flow passage)
F2 Second flow passage (coolant flow passage)
F3 Third flow passage (coolant flow passage)
S Bonding material
W Wiring member

What is claimed is:

1. A semiconductor module, comprising:
   a cooler including
      a first flow passage and a second flow passage disposed in parallel and being isolated from each other, the first flow passage and the second flow passage being respectively formed on a first side and a second side of the semiconductor module that are opposite to each other, and
      a third flow passage connecting the first flow passage and the second flow passage;
   a laminated substrate disposed on the cooler, the laminated substrate including
      a P-terminal, an N-terminal and an M-terminal, and
      a plurality of circuit boards provided side by side along a direction perpendicular to a direction of the third flow passage, the plurality of circuit boards including
         a first circuit board connected to the P-terminal,
         a second circuit board connected to the N-terminal, and
         a third circuit board connected to the M-terminal;
   a first sensing chip having a sensing function for detecting a temperature and a first non-sensing chip not having the sensing function, disposed on the first circuit board, side by side along the third flow passage; and
   a second sensing chip having the sensing function and a second non-sensing chip not having the sensing function, disposed on the third circuit board, side by side along the third flow passage, wherein
   the first sensing chip is disposed on the second side of the semiconductor module, and
   the second sensing chip is disposed on the first side of the semiconductor module.

2. The semiconductor module according to claim 1, wherein at least one of the first sensing chip and the second sensing chip further has another sensing function for detecting short-circuit.

3. The semiconductor module according to claim 1, further comprising a case member that houses the laminated substrate, wherein
   the case member includes a first terminal member and a second terminal member,
   the first sensing chip and the first terminal member are connected via a first wiring member, and
   the second sensing chip and the second terminal member are connected via a second wiring member.

4. The semiconductor module according to claim 3, wherein:
   the first and second terminal members are provided on the second side and the first side of the semiconductor module, respectively; and
   the first terminal member provided on the second side and the second terminal member provided on the first side are disposed to obliquely oppose to each other and sandwich the laminated substrate in a plan view of the semiconductor module.

5. The semiconductor module according to claim 1, further comprising a thermistor disposed on a top surface of the laminated substrate.

6. The semiconductor module according to claim 1, wherein:
   the P-terminal is disposed on the first side of the semiconductor module on the first circuit board; and
   the M-terminal is disposed on the second side of the semiconductor module on the third circuit board.

7. The semiconductor module according to claim 1, wherein:
   the P-terminal is disposed on the second side of the semiconductor module on the first circuit board; and
   the M-terminal is disposed on the first side of the semiconductor module on the third circuit board.

8. The semiconductor module according to claim 1, wherein
   the first flow passage has an introduction port, and
   the second flow passage has a discharge port.

* * * * *